(12) United States Patent
Tsunetsugu

(10) Patent No.: US 10,666,052 B2
(45) Date of Patent: May 26, 2020

(54) TRANSISTOR DRIVER AND GATE CONTROLLER

(71) Applicants: Kabushiki Kaisha Toshiba, Minato-ku, Tokyo (JP); Toshiba Electronic Devices & Storage Corporation, Minato-ku, Tokyo (JP)

(72) Inventor: Yukio Tsunetsugu, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 156 days.

(21) Appl. No.: 15/903,109

(22) Filed: Feb. 23, 2018

(65) Prior Publication Data

US 2019/0044338 A1  Feb. 7, 2019

(30) Foreign Application Priority Data

Aug. 7, 2017 (JP) .................................. 2017-152713

(51) Int. Cl.
*H02J 3/38* (2006.01)
*H03K 17/0812* (2006.01)
*H02M 1/00* (2006.01)
*H02J 3/12* (2006.01)

(52) U.S. Cl.
CPC .................. *H02J 3/38* (2013.01); *H02J 3/12* (2013.01); *H02M 1/00* (2013.01); *H03K 17/08128* (2013.01); *H02M 2001/0025* (2013.01)

(58) Field of Classification Search
CPC .... H02J 3/12; H02J 3/38; H02M 1/00; H02M 2001/0025; H03K 17/08128
USPC .............................................. 307/31
See application file for complete search history.

(56) References Cited

U.S. PATENT DOCUMENTS 5,825,237 A    10/1998 Ogawa

FOREIGN PATENT DOCUMENTS

| JP | S58-58907 B2 | 12/1983 |
| JP | H09-114534 A | 5/1997 |
| JP | 2007-236112 A | 9/2007 |

*Primary Examiner* — Hal Kaplan
(74) *Attorney, Agent, or Firm* — White & Case LLP

(57) ABSTRACT

In one embodiment, a transistor driver includes a first line as a power supply line configured to supply a first voltage, a second line as a power supply line configured to supply a second voltage, and a first controlling transistor provided between the first line and the second line and configured to control a gate voltage of a first transistor to be driven. The driver further includes a third line configured to supply a third voltage that controls a gate voltage of the first controlling transistor, and a power supply circuit connected to the first, second and third lines and configured to vary the third voltage. The driver further includes a depletion P-type transistor including a gate connected to the first line, a drain connected to the second line, and a source connected to the third line.

20 Claims, 4 Drawing Sheets

US 10,666,052 B2

TRANSISTOR DRIVER AND GATE CONTROLLER

CROSS REFERENCE TO RELATED APPLICATION

This application is based upon and claims the benefit of priority from the prior Japanese Patent Application No. 2017-152713, filed on Aug. 7, 2017, the entire contents of which are incorporated herein by reference.

FIELD

Embodiments described herein relate to a transistor driver and a gate controller.

BACKGROUND

To drive a power transistor such as an insulated gate bipolar transistor (IGBT), it is necessary to apply a high voltage of 10 V or more to its gate. Therefore, a gate voltage of the power transistor is often controlled by a high-side transistor and a low-side transistor with high breakdown voltages.

When a transistor driver that drives the high-side transistor and a transistor driver that drives the low-side transistor are activated, malfunction of these transistors may occur if a voltage of an intermediate voltage line between a power supply line on high voltage side and a power supply line on a low voltage side does not appropriately rise. Therefore, appropriate countermeasures to prevent such malfunction are desired.

DETAILED DESCRIPTION

Embodiments will now be explained with reference to the accompanying drawings.

In one embodiment, a transistor driver includes a first line as a power supply line configured to supply a first voltage, a second line as a power supply line configured to supply a second voltage, and a first controlling transistor provided between the first line and the second line and configured to control a gate voltage of a first transistor to be driven. The driver further includes a third line configured to supply a third voltage that controls a gate voltage of the first controlling transistor, and a power supply circuit connected to the first, second and third lines and configured to vary the third voltage. The driver further includes a depletion P-type transistor including a gate connected to the first line, a drain connected to the second line, and a source connected to the third line.

(First Embodiment)

Figure 1:
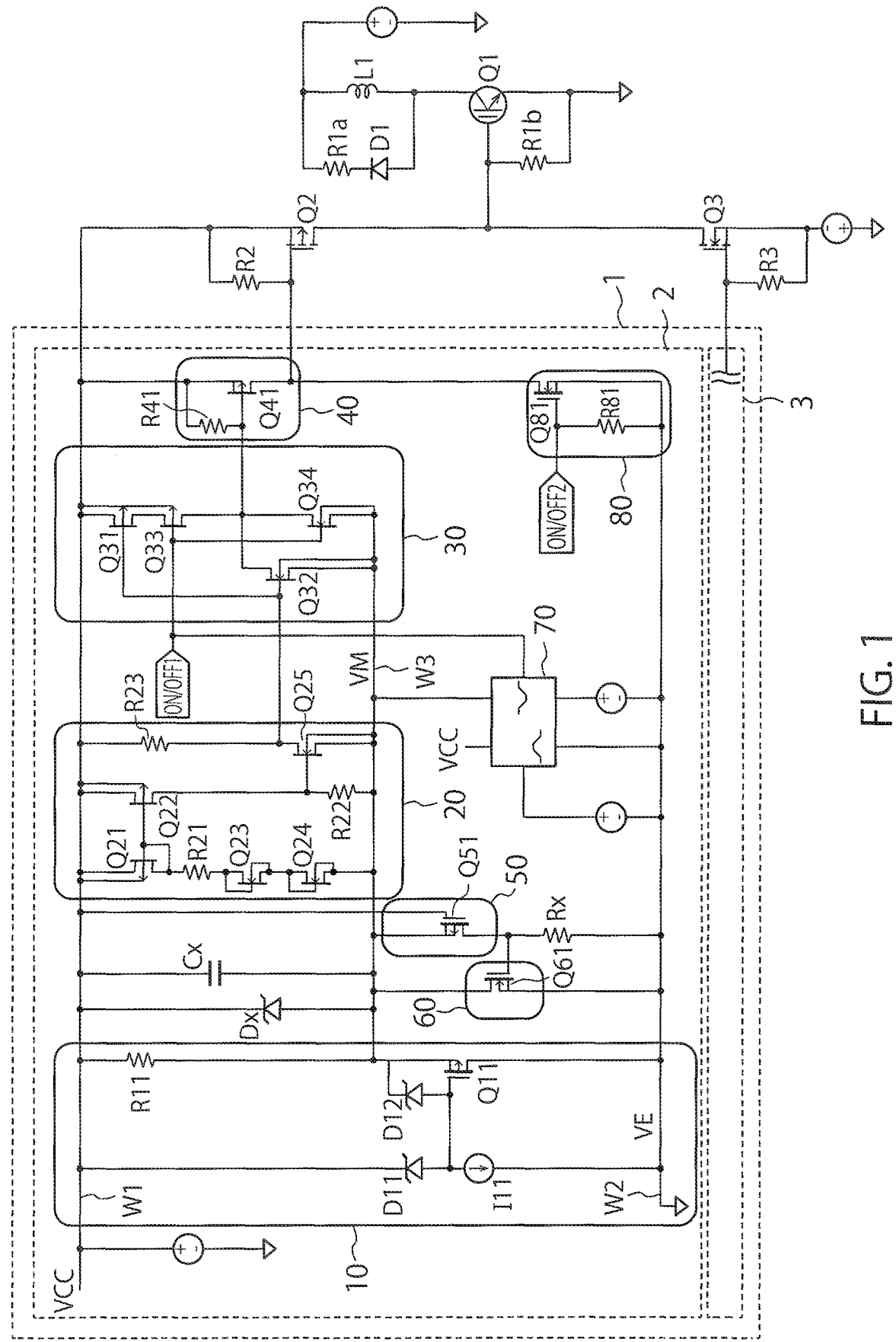
FIG. 1 is a circuit diagram illustrating a configuration of a gate controller of a first embodiment.

FIG. 1 is a circuit diagram illustrating a configuration of a gate controller 1 of a first embodiment.

The gate controller 1 controls a gate voltage of a power transistor Q1 with use of a high-side transistor Q2 and a low-side transistor Q3. The power transistor Q1 is an example of a transistor to be controlled, the high-side transistor Q2 is an example of a first transistor, and the low-side transistor Q3 is an example of a second transistor.

The power transistor Q1 includes a collector, an emitter, and a gate. The collector is connected to an electric resistor R1a, a diode D1, and an inductor L1. The emitter and the gate are connected to an electric resistor R1b. The power transistor Q1 of the present embodiment is an IGBT.

The high-side transistor Q2 includes a gate and a source both connected to an electric resistor R2, and a drain connected to the gate of the power transistor Q1. The high-side transistor Q2 of the present embodiment is a PMOSFET.

The low-side transistor Q3 includes a gate and a source both connected to an electric resistor R3, and a drain connected to the gate of the power transistor Q1. The low-side transistor Q3 of the present embodiment is an NMOSFET.

As illustrated in FIG. 1, the gate controller 1 includes a PMOS driver 2 that drives the high-side transistor Q2, and an NMOS driver 3 that drives the low-side transistor Q3. The PMOS driver 2 is an example of a first transistor driver, and the NMOS driver 3 is an example of a second transistor driver.

The PMOS driver 2 and the NMOS driver 3 of the present embodiment each include the substantially same circuit configuration. Therefore, in the following, the configuration of the PMOS driver 2 is described, and description of the configuration of the NMOS driver 3 is omitted. The following description for the PMOS driver 2 is applicable to the NMOS driver 3.

The PMOS driver 2 includes a power supply circuit 10, a voltage detector (detecting circuit) 20, a CMOS logic circuit 30, a first switching circuit 40, a depletion P-type transistor module 50, a breaking auxiliary transistor module 60, a level shift circuit 70, and a second switching circuit 80. The PMOS driver 2 further includes a VCC line W1, a VE line W2, and a VM line W3.

The VCC line W1 is a power supply line that supplies a VCC voltage. The VCC line W1 is an example of a first line, and the VCC voltage is an example of a first voltage. The VCC voltage of the present embodiment is a positive voltage. The source of the high-side transistor Q2 is connected to the VCC line W1.

The VE line W2 is a power supply line that supplies a VE voltage lower than the VCC voltage. The VE line W2 is an example of a second line, and the VE voltage is an example of a second voltage. The VE voltage of the present embodiment is set to 0 V. In the following, the VE line W2 is also appropriately referred to as "GND line W2", and the VE voltage is also appropriately referred to as "GND voltage".

The first switching circuit 40 is provided between the VCC line W1 and the VE line W2, and includes a transistor Q41 and an electric resistor R41. The transistor Q41 includes a gate connected to the electric resistor R41, a source connected to the electric resistor R41 and the VCC line W1, and a drain connected to the gate of the high-side transistor Q2, and controls a gate voltage of the high-side transistor Q2. The transistor Q41 of the present embodiment is a P-type double-diffused MOSFET (DMOSFET), namely, PDMOS. The transistor Q41 is an example of a first controlling transistor.

The second switching circuit 80 is provided between the VCC line W1 and the VE line W2, and includes a transistor Q81 and an electric resistor R81. The transistor Q81 includes a gate connected to the electric resistor R81, a source connected to the electric resistor R81 and the VE line W2, and a drain connected to the gate of the high-side transistor Q2, and controls the gate voltage of the high-side transistor Q2. The transistor Q81 of the present embodiment is an N-type DMOSFET, namely, NDMOS.

The VM line W3 is a line that supplies a UM voltage. The VM voltage is a reference voltage controlling a gate voltage of the transistor Q41. The VM line W3 is an example of a third line, and the VM voltage is an example of a third voltage. The VM voltage corresponds to a floating voltage.

The power supply circuit 10 is connected to the VCC line W1, the VE line W2, and the VM line W3, and raises the VM voltage from 0 V (GND voltage) in activation of the VCC line W1. The power supply circuit 10 includes a transistor Q11, a current source I11, an electric resistor R11, and diodes D11 and D12.

The current source I11 and the diode D11 are connected in series to each other between the VCC line W1 and the VE line W2. Likewise, the transistor Q11 and the electric resistor R11 are connected in series to each other between the VCC line W1 and the VE line W2. The transistor Q11 includes a gate connected to a node between the current source I11 and the diode D11, a source provided on the VCC line W1 side, and a drain provided on the VE line W2 side. The diode D12 includes an anode connected to the gate of the transistor Q11, and a cathode connected to the source of the transistor Q11. Each of the diodes D11 and D12 of the present embodiment is a Zener diode. The transistor Q11 of the present embodiment is a PMOSFET.

The electric resistor R11 is disposed between the VCC line W1 and the VM line W3. A current flows from the VCC line W1 to the VM line W3 through the electric resistor R11, and the VM voltage rises from 0 V, in activation of the VCC line W1. The electric resistor R11 is connected in parallel to a diode Dx and a capacitor Cx between the VCC line W1 and the VM line W3. The diode Dx and the capacitor Cx configure a clamp circuit that operates so as to prevent a difference between the VCC voltage and the VM voltage from being excessively large. The diode Dx of the present embodiment is a Zener diode, and makes it possible to limit the difference between the VCC voltage and the VM voltage to a predetermined value or lower.

The voltage detector 20 is connected to the VCC line W1 and the VM line W3, and operates so as to adjust the VM voltage to a predetermined voltage. More specifically, the voltage detector 20 controls an output voltage from the voltage detector 20 to the CMOS logic circuit 30 so as to prevent the transistor Q41 from being turned on until the VM voltage exceeds a lower limit value. In other words, the voltage detector 20 controls timing at which the transistor Q41 is tuned on, based on the VM voltage. The voltage detector 20 includes transistors Q21 to Q25 and electric resistors R21 to R23.

The transistor Q21 includes a source connected to the VCC line W1, and a drain and a gate both connected to the electric resistor R21. The transistor Q22 includes a source connected to the VCC line W1, a drain connected to the VM line W3 through the electric resistor R22, and a gate connected to the drain and the gate of the transistor Q21. Each of the transistors Q21 and Q22 of the present embodiment is a PMOSFET.

The transistor Q23 includes a drain and a gate both connected to the electric resistor R21. The transistor Q24 includes a drain and a gate both connected to a source of the transistor Q23, and a source connected to the VM line W3. The transistor Q25 includes a gate connected to a node between the transistor Q22 and the electric resistor R22, a source connected to the VM line W3, and a drain connected to the VCC line W1 through the electric resistor R23. An output voltage from the voltage detector 20 is outputted to the CMOS logic circuit 30 from a node between the transistor Q25 and the electric resistor R23. Each of the transistors Q23 to Q25 of the present embodiment is an NMOSFET.

The CMOS logic circuit 30 is connected to the VCC line W1 and the VM line W3, and controls the gate voltage of the transistor Q41 by NOR logic. The CMOS logic circuit 30 includes a transistor Q31 as a PMOSFET, a transistor Q32 as an NMOSFET, a transistor Q33 as a PMOSFET, and a transistor Q34 as an NMOSFET.

The transistor Q31 includes a gate that receives an output signal (output voltage) of the voltage detector 20, and a source connected to the VCC line W1. The transistor Q32 includes a gate that receives the above-described output signal, and a source connected to the VM line W3. The transistor Q33 includes a gate, a source connected to the drain of the transistor Q31, and a drain connected to the drain of the transistor Q32. The gate of the transistor Q33 receives a control signal (ON/OFF1) to control ON/OFF of the transistor Q41 through the transistor Q33. The transistor Q34 includes a gate that receives the above-described control signal, a source connected to the VM line W3, and a drain connected to the drains of the respective transistors Q32 and Q33. In the CMOS logic circuit 30, the transistors Q31 to Q34 configure an NOR gate by two complementary MOSs (CMOS).

The CMOS logic circuit 30 outputs, to the gate of the transistor Q41, a signal that indicates a result of NOR operation of the output signal and the control signal described above. Therefore, even when the control signal is turned on, the transistor Q41 is not turned on while the output signal is off (until VM voltage exceeds lower limit value). The signal from the CMOS logic circuit 30 is outputted from the node between the transistor Q33 and the transistor Q34.

The depletion P-type transistor module 50 includes a depletion P-type transistor Q51. The depletion P-type transistor Q51 includes a gate connected to the VCC line W1, a source connected to the VM line W3, and a drain connected to the VE line W2 through an electric resistor Rx. The depletion P-type transistor Q51 of the present embodiment is a PDMOS. In the following, the depletion P-type transistor Q51 is also appropriately abbreviated to "transistor Q51".

An action of the transistor Q51 is described. As described above, the current flows from the VCC line W1 to the VM line W3 through the electric resistor R11 and the VM voltage rises from 0 V, in activation of the VCC line W1. At this time, if a rising speed of the VM voltage is low, an issue that the PMOS driver 2 takes a long time from activation start to activation completion occurs. Further, if the VM voltage does not become an appropriate value in a short time, the circuits (such as voltage detector 20 and CMOS logic circuit 30) operating based on the VM voltage may not correctly operate. This causes malfunction of the transistor Q41, which may cause malfunction of the high-side transistor Q2. For example, the transistor Q41 may be turned on during a period in which the transistor Q41 is to be turned off.

Accordingly, the PMOS driver 2 of the present embodiment includes the depletion P-type transistor Q51 between the VM line W3 and the VE line W2. The depletion P-type transistor Q51 has a property that the current flows between the source and the drain even at the gate voltage of 0 V. Therefore, the current flows through the transistor Q51 also immediately after activation of the VCC line W1. As a result, the current easily flows through the VM line W3 from the VCC line W1 through the electric resistor R11, which makes it possible to rapidly raise the VM voltage. This makes it possible to prevent malfunction of the transistor Q41 and the high-side transistor Q2.

The breaking auxiliary transistor module 60 includes a breaking auxiliary transistor Q61. The breaking auxiliary transistor Q61 includes a gate connected to the drain of the transistor Q51, a source connected to the VE line W2, and a drain connected to the VM line W3. The breaking auxiliary transistor Q61 of the present embodiment is an NMOSFET. In the following, the breaking auxiliary transistor Q61 is also appropriately abbreviated to "transistor Q61".

An action of the transistor Q61 is described. The source and the drain of the depletion P-type transistor Q51 are automatically broken when the gate voltage rises. The break is desirably rapidly executed. In the present embodiment, the breaking auxiliary transistor Q61 detects a drain current of the depletion P-type transistor Q51, and reflects the detection result in the VM voltage. This allows for rapid execution of the above-described break.

The level shift circuit 70 is a circuit that adjust the VM voltage, based on the VCC voltage, the VE voltage, and the ON/OFF control signal (ON/OFF1) for the transistor Q41. This makes it possible to adjusts the operation of the PMOS driver 2 to appropriate operation.

In the following, a threshold voltage $V_{TH}$ of the depletion P-type transistor Q51 is described.

A plurality of CMOSs are disposed between the VM line W3 and the transistor Q41 of the present embodiment. Examples of the CMOSs include two CMOSs configuring the CMOS logic circuit 30. An unillustrated other CMOS may also be disposed between the VM line W3 and the transistor Q41. For example, a plurality of CMOSs may be disposed between the voltage detector 20 and the CMOS logic circuit 30.

In the present embodiment, an absolute value ($|V_{TH}|$) of the threshold voltage $V_{TH}$ of the transistor Q51 is set to be equal to or larger than a minimum value among the operation voltages of all of the CMOSs provided between the VM line W3 and the transistor Q41. For example, in a case where CMOS1, CMOS2, and CMOS3 are provided between the VM line W3 and the transistor Q41 and operation voltages thereof are respectively $V_{C1}$, $V_{C2}$, and $V_{C3}$, the absolute value of the threshold voltage $V_{TH}$ is equal to or larger than the minimum value among the operation voltages $V_{C1}$, $V_{C2}$, and $V_{C3}$.

In a case where the threshold voltages of a PMOSFET and an NMOSFET configuring each of the CMOSs are respectively represented by $V_{TH-P}$ and $V_{TH-N}$, the operation voltage Vc of each of the CMOSs is provided by $|V_{TH-P}|+V_{TH-N}$ (VC=$|V_{TH-P}|+V_{TH-N}$). Accordingly, the absolute value of the threshold voltage $V_{TH}$ of the transistor Q51 is equal to or larger than the minimum value among the operation voltages $|V_{TH-P}|+V_{TH-N}$ of all of the CMOSs.

According to the present embodiment, the absolute value of the threshold voltage $V_{TH}$ is set to be equal to or larger than the minimum value among the operation voltages of all of the CMOSs, which makes it possible to operate the depletion P-type transistor Q51 so as to normally operate all of the CMOSs.

Further, as described above, the diode Dx and the capacitor Cx of the present embodiment configure the clamp circuit that operates so as to prevent the difference between the VCC voltage and the VM voltage from being excessively large. The clamp circuit of the present embodiment is configured to operate such that the difference between the VCC voltage and the VM voltage does not exceed the breakdown voltage of all of the CMOSs. This makes it possible to prevent occurrence of insulation breakdown of the CMOS in activation.

Next, operation of the PMOS driver 2 is described.

In activation of the VCC line W1, the current flow from the VCC line W1 to the VM line W3 through the electric resistor R11 and the VM voltage rises from 0 V. At this time, the depletion P-type transistor Q51 detects the VCC voltage and the VM voltage to cause an activation current to flow. The depletion P-type transistor Q51 has a property that the current flows between the source and the drain even at the gate voltage of 0 V. Therefore, the activation current flows immediately after activation of the VCC line W1. Accordingly, the VM voltage in activation linearly rises without a dead zone as the VCC voltage rises. This makes it possible to rapidly raise the VM voltage, and to prevent malfunction of the transistor Q41 and the high-side transistor Q2.

In contrast, when the VM voltage reaches a regular voltage, the activation current is automatically reduced. At this time, the breaking auxiliary transistor Q61 detects the drain current of the depletion P-type transistor Q51, and reflects the detection result in the VM voltage. This makes it possible to rapidly reduce the activation current.

Further, the CMOS logic circuit 30 performs NOR operation of the output signal from the current detection circuit 20 and the ON/OFF control signal (ON/OFF1) for the transistor 15 Q41, thereby outputting a signal indicating a result of the NOR operation, to the gate of the transistor Q41. More specifically, when the output signal and the control signal both become low level, the signal indicating the result of the NOR operation becomes high level and the transistor Q41 is turned on. In 20 activation of the VCC line W1 of the present embodiment, the output signal becomes high level because of the low VM voltage. Accordingly, in activation of the VCC line W1, the signal indicating the result of the NOR operation becomes low level, which makes it possible to realize on start of the transistor Q41, 25 off start of the high-side transistor Q2, and off start of the transistor Q1.

Figure 2:
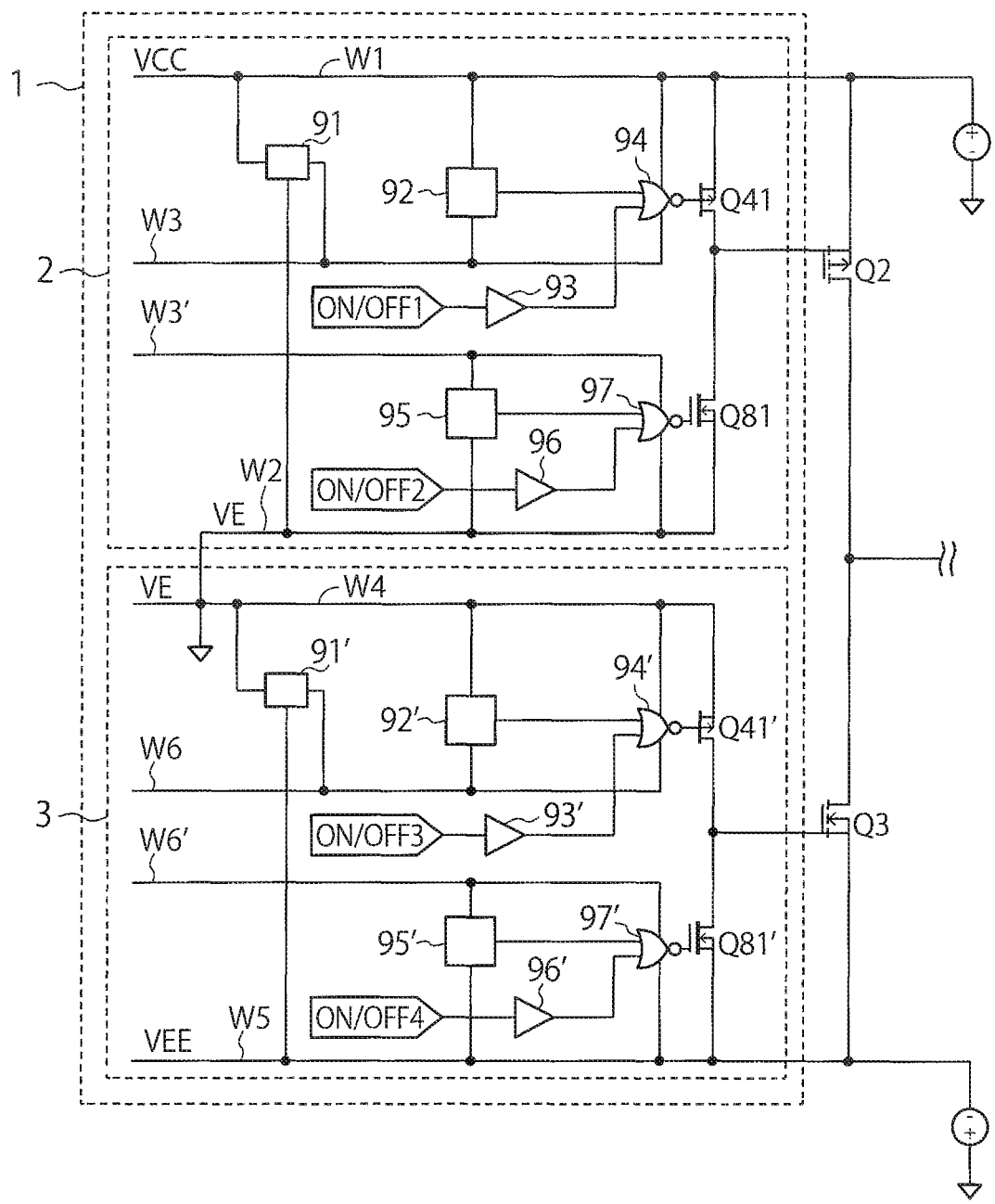
FIG. 2 is a circuit diagram schematically illustrating the configuration of the gate controller of the first embodiment.

FIG. 2 is a circuit diagram schematically illustrating the configuration of the gate controller 1 of the first embodiment.

As illustrated in FIG. 2, the PMOS driver 2 includes circuit blocks 91 and 92 to control the transistor Q41, a buffer circuit 93, a NOR gate circuit 94, a circuit block 95 to control the transistor Q81, a buffer circuit 96, and a NOR gate circuit 97. The PMOS driver 2 further includes the VCC line W1, the VE line W2, the line (VM line) W3, and a line W3'. The line W3 supplies the reference voltage (VM voltage) controlling the gate voltage of the transistor Q41. The line W3' supplies a reference voltage controlling a gate voltage of the transistor Q81.

The circuit block 91, the circuit block 92, and the NOR gate circuit 94 respectively correspond to the depletion P-type transistor module 50, the voltage detector 20, and the CMOS logic circuit 30 in FIG. 1. Operation of the transistor Q41 is controlled by the NOR gate circuit 94, based on an output signal from the circuit block 92 and a control signal (ON/OFF1) passed through the buffer circuit 93.

The circuit block 95 and the NOR gate circuit 97 respectively have configurations and functions similar to those of the voltage detector 20 and the CMOS logic circuit 30. Operation of the transistor Q81 is controlled by the NOR gate circuit 97, based on an output signal from the circuit block 95 and a control signal (ON/OFF2) passed through the buffer circuit 96.

As with the PMOS driver 2, the NMOS driver 3 also includes circuit blocks 91' and 92' to control a transistor Q41', a buffer circuit 93', a NOR gate circuit 94', a circuit block 95' to control a transistor Q81', a buffer circuit 96', and a NOR gate circuit 97'. The NMOS driver 3 further includes a VE line W4 that functions similarly to the VCC line W1, a VEE line W5 that functions similarly to the VE line W2, a line W6 that functions similarly to the line W3, and a line W6' that functions similarly to the line W3'. The VE line W4, the VEE line W5, and the line W6 are respectively examples of fourth, fifth, and sixth lines. A VEE voltage of the present embodiment is a negative voltage.

The circuit block 91', the circuit block 92', and the NOR gate circuit 94' respectively have configurations and functions similar to those of the depletion P-type transistor module 50, the voltage detector 20, and the CMOS logic circuit 30. Operation of the transistor Q41' is controlled by the NOR gate circuit 94', based on an output signal from the circuit block 92' and a control signal (ON/OFF3) passed through the buffer circuit 93'. The transistor 41' is an example of a second controlling transistor.

The circuit block 95' and the NOR gate circuit 97' respectively have configurations and functions similar to those of the voltage detector 20 and the CMOS logic circuit 30. Operation of the transistor Q81' is controlled by the NOR gate circuit 97', based on an output signal from the circuit block 95' and a control signal (ON/OFF4) passed through the buffer circuit 96'.

The other configurations of the NMOS driver 3 are also similar to those of the PMOS driver 2. For example, the NMOS driver 3 includes components that respectively have configurations and functions similar to those of the power circuit 10, the breaking auxiliary transistor module 60, and the level shift circuit 70 in FIG. 1.

FIGS. 3A to 3H are waveform diagrams to explain the operation of the gate controller 1 of the first embodiment.

Figure 3:
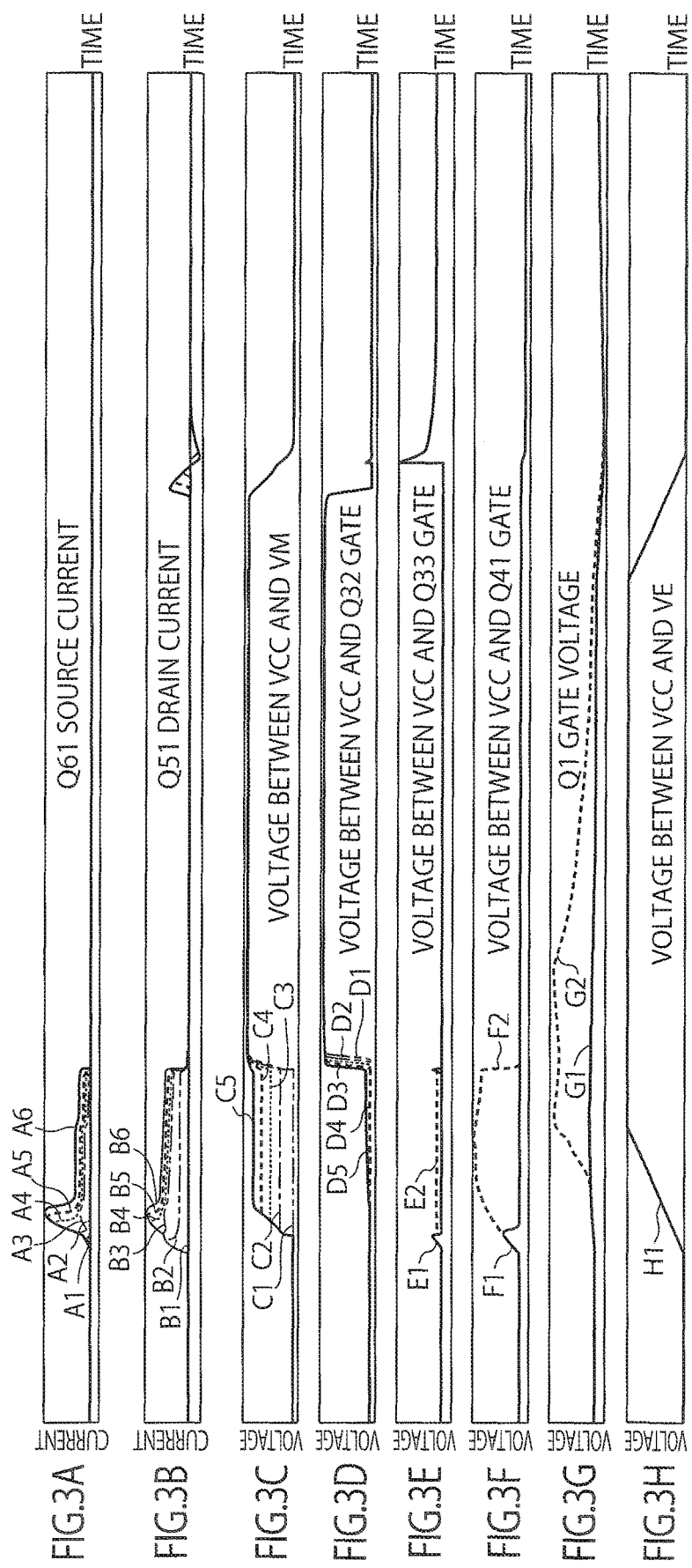
FIGS. 3A to 3H are waveform diagrams to explain operation of the gate controller of the first embodiment.

FIG. 3A illustrates a source current of the breaking auxiliary transistor Q61. FIG. 3B illustrates the drain current of the depletion P-type transistor Q51. FIG. 3C illustrates the difference between the VCC voltage and the VM voltage. FIG. 3D illustrates a difference between the VCC voltage and a gate voltage of the transistor Q32. Variation of a waveform from A1 to A6 indicates variation of the waveform associated with the increase of the threshold voltage $V_{TH}$ of the depletion P-type transistor Q51. The same applies to waveforms B1 to B6, C1 to C5, and D1 to D5. It is found from these graphs that activation of the VCC line W1 rapidly progresses associated with the increase of the threshold voltage $V_{TH}$. This is because the increase of the threshold voltage $V_{TH}$ facilitates flow of the drain current of the transistor Q51, and further facilitates flow of the source current of the transistor Q61, which facilitates flow of the current from the VCC line W1 to the VM line W3. This rapidly increases the difference between the VCC voltage and the VM voltage.

FIG. 3E illustrates a difference between the VCC voltage and a gate voltage of the transistor Q33. FIG. 3F illustrates a difference between the VCC voltage and the gate voltage of the transistor Q41. FIG. 3G illustrates the gate voltage of the transistor Q1. FIG. 3H illustrates a difference between the VCC voltage and the VE voltage. Waveforms E1, F1, G1, and H1 each indicate a waveform when the transistor Q51 is provided, and waveforms E2, F2, G2, and H2 each indicate a waveform when the transistor Q51 is not provided. It is found from these graphs that the transistor Q51 suppresses false fluctuation of the gate voltage of the transistor Q1 and the like, in activation of the VCC line W1. Therefore, according to the present embodiment, providing the transistor Q51 in the PMOS driver 2 makes it possible to effectively prevent malfunction of the transistor Q1.

Figure 4:
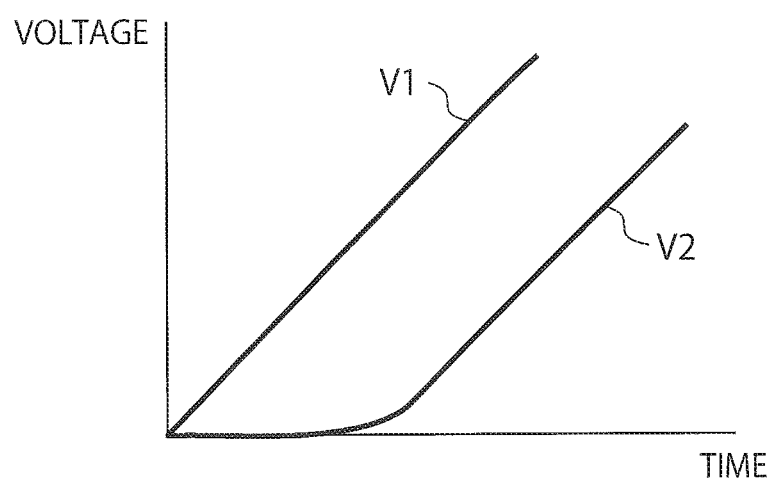
FIG. 4 is a graph to explain advantages of the gate controller of the first embodiment.

FIG. 4 is a graph to explain advantages of the gate controller 1 of the first embodiment.

A curve V1 indicates variation of the VM voltage with time in activation when the transistor Q51 is provided. A curve V2 indicates variation of the VM voltage with time in activation when the transistor Q51 is not provided.

As understood from the curve V2, a dead zone is present in the variation of the VM voltage and the VM voltage does not rapidly rise when the transistor Q51 is not provided. On the other hand, when the transistor Q51 is provided, the VM voltage linearly rises without a dead zone as illustrated by the curve V1. This is because the depletion P-type transistor Q51 has the property that the current flows between the source and the drain even at the gate voltage of 0 V, and the current accordingly flows through the transistor Q51 even immediately after activation of the VCC line W1. This makes it possible to rapidly raise the VM voltage.

As described above, the PMOS driver 2 of the present embodiment includes the depletion P-type transistor Q51 that includes the gate connected to the VCC line W1, the source connected to the VM line W3, and the drain connected to the VE line W2. Therefore, according to the present embodiment, it is possible to rapidly raise the VM voltage, and to prevent malfunction of the transistor Q41 and the high-side transistor Q2. The same applies to the NMOS driver 3 of the present embodiment. According to the present embodiment, it is possible to prevent malfunction of the transistor Q41' and the low-side transistor Q3.

While certain embodiments have been described, these embodiments have been presented by way of example only, and are not intended to limit the scope of the inventions. Indeed, the novel drivers and controllers described herein may be embodied in a variety of other forms; furthermore, various omissions, substitutions and changes in the form of the drivers and controllers described herein may be made without departing from the spirit of the inventions. The accompanying claims and their equivalents are intended to cover such forms or modifications as would fall within the scope and spirit of the inventions.

The invention claimed is:

1. A transistor driver comprising:
    a first line as a power supply line configured to supply a first voltage;
    a second line as a power supply line configured to supply a second voltage;
    a first controlling transistor provided between the first line and the second line and configured to control a gate voltage of a first transistor to be driven;
    a third line configured to supply a third voltage that controls a gate voltage of the first controlling transistor;
    a power supply circuit connected to the first, second and third lines and configured to vary the third voltage; and
    a depletion P-type transistor including a gate connected to the first line, a drain connected to the second line, and a source connected to the third line.

2. The driver of claim 1, wherein an absolute value of a threshold voltage of the depletion P-type transistor is equal to or larger than a minimum value among operation voltages of a plurality of CMOSs provided between the third line and the first controlling transistor.

3. The driver of claim 2, further comprising a clamp circuit provided between the first line and the third line, and configured to operate to cause a difference between the first voltage and the third voltage not to exceed breakdown voltages of the CMOSs.

4. The driver of claim 3, wherein the clamp circuit includes a Zener diode.

5. The driver of claim 1, further comprising a transistor including a gate connected to a drain of the depletion P-type transistor, a source connected to the second line, and a drain connected to the third line.

6. The driver of claim 1, further comprising a logic circuit connected to the first line and the third line, and configured to control a gate voltage of the first controlling transistor by NOR logic.

7. The driver of claim 6, wherein the logic circuit includes a plurality of CMOSs.

8. The driver of claim 1, further comprising a voltage detector connected to the first line and the third line, and configured to control timing at which the first controlling transistor is turned on, based on the third voltage.

9. The driver of claim 1, wherein the power supply circuit includes an electric resistor provided between the first line and the third line.

10. A gate controller comprising:
a first transistor driver configured to drive a first transistor that controls a gate voltage of a transistor to be controlled; and
a second transistor driver configured to drive a second transistor that controls the gate voltage of the transistor to be controlled,
wherein
the first transistor driver comprises:
a first line as a power supply line configured to supply a first voltage;
a second line as a power supply line configured to supply a second voltage;
a first controlling transistor provided between the first line and the second line and configured to control a gate voltage of the first transistor;
a third line configured to supply a third voltage that controls a gate voltage of the first controlling transistor;
a power supply circuit connected to the first, second and third lines and configured to vary the third voltage; and
a depletion P-type transistor including a gate connected to the first line, a drain connected to the second line, and a source connected to the third line, and
the second transistor driver comprises:
a fourth line as a power supply line configured to supply a fourth voltage;
a fifth line as a power supply line configured to supply a fifth voltage;
a second controlling transistor provided between the fourth line and the fifth line and configured to control a gate voltage of the second transistor;
a sixth line configured to supply a sixth voltage that controls a gate voltage of the second controlling transistor;
a power supply circuit connected to the fourth, fifth and sixth lines and configured to vary the sixth voltage; and
a depletion P-type transistor including a gate connected to the fourth line, a drain connected to the fifth line, and a source connected to the sixth line.

11. The controller of claim 10, wherein an absolute value of a threshold voltage of the depletion P-type transistor in the first transistor driver is equal to or larger than a minimum value among operation voltages of a plurality of CMOSs provided between the third line and the first controlling transistor.

12. The controller of claim 10, further comprising a transistor including a gate connected to a drain of the depletion P-type transistor in the first transistor driver, a source connected to the second line, and a drain connected to the third line.

13. The controller of claim 10, further comprising a logic circuit connected to the first line and the third line, and configured to control a gate voltage of the first controlling transistor by NOR logic.

14. The controller of claim 10, further comprising a voltage detector connected to the first line and the third line, and configured to control timing at which the first controlling transistor is turned on, based on the third voltage.

15. The controller of claim 10, wherein the power supply circuit in the first transistor driver includes an electric resistor provided between the first line and the third line.

16. The controller of claim 10, wherein an absolute value of a threshold voltage of the depletion P-type transistor in the second transistor driver is equal to or larger than a minimum value among operation voltages of a plurality of CMOSs provided between the sixth line and the second controlling transistor.

17. The controller of claim 10, further comprising a transistor including a gate connected to a drain of the depletion P-type transistor in the second transistor driver, a source connected to the fifth line, and a drain connected to the sixth line.

18. The controller of claim 10, further comprising a logic circuit connected to the fourth line and the sixth line, and configured to control a gate voltage of the second controlling transistor by NOR logic.

19. The controller of claim 10, further comprising a voltage detector connected to the fourth line and the sixth line, and configured to control timing at which the second controlling transistor is turned on, based on the sixth voltage.

20. The controller of claim 10, wherein the power supply circuit in the second transistor driver includes an electric resister provided between the fourth line and the sixth line.

* * * * *